(12) United States Patent
Bensalah et al.

(10) Patent No.: US 11,750,142 B2
(45) Date of Patent: Sep. 5, 2023

(54) SYSTEM FOR CONVERTING ENERGY

(71) Applicant: THALES, Courbevoie (FR)

(72) Inventors: Taoufik Bensalah, Chatou (FR); Joël Lallier, Elancourt (FR); Maxime Migneau, Chatou (FR); Damien Peyrat, Chatou (FR)

(73) Assignee: THALES, Courbevoie (FR)

( * ) Notice: Subject to any disclaimer, the term of this patent is extended or adjusted under 35 U.S.C. 154(b) by 493 days.

(21) Appl. No.: 17/252,688

(22) PCT Filed: Jun. 21, 2019

(86) PCT No.: PCT/EP2019/066467
§ 371 (c)(1),
(2) Date: Dec. 15, 2020

(87) PCT Pub. No.: WO2019/243572
PCT Pub. Date: Dec. 26, 2019

(65) Prior Publication Data
US 2021/0119568 A1 Apr. 22, 2021

(30) Foreign Application Priority Data
Jun. 22, 2018 (FR) ...................................... 1800652

(51) Int. Cl.
*H02P 29/68* (2016.01)
*B64D 31/00* (2006.01)
(Continued)

(52) U.S. Cl.
CPC .............. *H02P 29/68* (2016.02); *B64D 13/06* (2013.01); *B64D 31/00* (2013.01); *B64D 41/00* (2013.01);
(Continued)

(58) Field of Classification Search
CPC ......... H02P 29/68; B64D 13/06; B64D 31/00; B64D 2013/0648; B64D 2221/00
(Continued)

(56) References Cited

U.S. PATENT DOCUMENTS
2012/0273920 A1 11/2012 Fedorov et al.

FOREIGN PATENT DOCUMENTS
DE 10 2014 213 545 A1 4/2015
FR 2 997 172 A1 4/2014
(Continued)

OTHER PUBLICATIONS

CN 102593100 A "Base Plate For Electronic Device and Electronic Device" Date Published: Jul. 18, 2012 Sekine (Year: 2012).*
(Continued)

*Primary Examiner* — Jorge L Carrasquillo
(74) *Attorney, Agent, or Firm* — BakerHostetler

(57) ABSTRACT

A system includes one or more electric motors, this system comprising a set of at least one load and an inverter comprising transistors, the inverter being intended to convert a DC voltage into an AC voltage that is intended to electrically power the set of at least one load, the inverter being able to be in a set of states comprising a nominal regime and a transitory regime wherein the set of at least one load draws, from the inverter, a power higher than a maximum power drawn from the inverter when the inverter is in nominal regime, the electrical-energy-converting system comprising means for cooling the transistors comprising a holder that is joined to at least one of the transistors of the inverter, the holder comprising a phase-change material that is able to melt, the system comprising one or more electric motors being configured so that, at a preset ambient temperature, the phase-change material melts when the inverter is in the transitory regime and so that, at this ambient temperature, the phase-change material does not melt when the inverter is in the nominal regime.

13 Claims, 2 Drawing Sheets

(51) Int. Cl.
  *B64D 41/00* (2006.01)
  *B64D 13/06* (2006.01)
(52) U.S. Cl.
  CPC .. *B64D 2013/0648* (2013.01); *B64D 2221/00* (2013.01)
(58) Field of Classification Search
  USPC .......................................................... 318/472
  See application file for complete search history.

(56) References Cited

FOREIGN PATENT DOCUMENTS

| | | |
|---|---|---|
| WO | 2012/107523 A1 | 8/2012 |
| WO | 2016/154784 A1 | 10/2016 |

OTHER PUBLICATIONS

WO 2007075130 A1 "Device and Method for Cooling a Power Device" Date Published: Jul. 5, 2007 Isberg (Year: 2007).*
DE 102014213545 A1 "The Power Semiconductor Module" Date Published: Apr. 23, 2015 Amende (Year: 2015).*
CN 1988330 A "Rotating Machine And Manufacturing Method Thereof" Date Published: Jun. 27, 2007 Yoshihara (Year: 2007).*

* cited by examiner

SYSTEM FOR CONVERTING ENERGY

CROSS-REFERENCE TO RELATED APPLICATIONS

This application is a National Stage of International patent application PCT/EP2019/066467, filed on Jun. 21, 2019, which claims priority to foreign French patent application No. FR 1800652, filed on Jun. 22, 2018, the disclosures of which are incorporated by reference in their entirety.

FIELD OF THE INVENTION

The invention relates to the field of energy conversion for engine-control applications. These applications are especially applicable to the aeronautic field and include applications requiring electric machines or, more generally, loads to be powered electrically in nominal and transient regimes.

BACKGROUND

The invention relates to an energy-converting system of the type comprising a plurality of loads able to comprise at least one electric machine and an inverter intended to convert electrical energy delivered to its input of the converter into electrical energy intended to power the various loads in alternation. One electric machine may be mechanically coupled to a main turbojet of the aircraft, so that the mechanical energy generated by the electric machine, for example the mechanical torque generated by the electric machine, is able to start the turbine. Another electric machine may be connected to the output of the inverter and mechanically coupled to a turboshaft engine of an auxiliary unit auxiliary power unit (APU). The electric machine is able to start the turboshaft engine. The turboshaft engine actuates an air compressor in order to deliver all the pneumatic power required by the aircraft. It may serve to start the jets or turboprops or to provide the cabin with air-conditioning. Generators, or most often alternators, are also hitched to the turboshaft engine with a view to delivering electrical power on board the aircraft. An environmental control system or ECS may also be connected to the output of the inverter so that it may be powered by the inverter throughout the rest of the duration of the flight.

During the phase in which the ECS is powered by the inverter, the inverter operates in nominal regime. The ECS draws a substantially constant amount of power from the inverter.

The phases of start-up of the main turbojet and of the turboshaft engine of the APU are momentary phases, i.e. transitory phases of short duration (typically shorter than 60 seconds or 120 seconds or 150 seconds), during which the inverter operates in transitory regime. These transitory phases may be repetitive. The turbines or turboshaft engines may undergo a plurality of successive start-ups. In these transitory phases, the power drawn from the inverter is higher than the power drawn from the inverter in nominal regime. The inverter is overloaded.

The energy-converting system may comprise a plurality of inverters connected to one electric machine or to one load and that each deliver as output a voltage intended to be supplied to the load. The inverters are able to power the load simultaneously. A stage of operation of the inverter in nominal regime may be a stage in which the load is powered by all of the inverters. A phase in transitory regime may be a stage in which at least one of the inverters does not power the load, for example because of failure of the inverter. In other words, only a subset of the inverters powers the load.

The inverters are of the type comprising power transistors based on silicon carbide or silicon for example metal-oxide-semiconductor field-effect transistors (MOSFETs) or insulated-gate bipolar transistors (IGBTs).

Such energy-converting systems conventionally a cooling system in order to avoid temperature rises liable to cause deterioration of the power transistors of the inverter or to accelerate their ageing.

The inverters are conventionally dimensioned to operate in the 2 types of regime (transitory and steady-state). The (transitory) overload regime means that the cooling system of the inverter must be overdimensioned, this resulting in a larger volume and greater weight. Such a solution is bulky and heavy, this being very disadvantageous in environments in which the problems of decreasing weight and bulk must be addressed, such as electric vehicles, such as motor vehicles, railway vehicles or aircraft.

Specifically, cooling systems comprising coolers taking the form of fin-comprising aluminum holders already exist. Such holders allow, because of their heat capacity, the thermal energy given off by the electronic components of the converter to be stored. A dissipator may be associated with an air-convection system of the type for example comprising a fan ensuring a forced flow of air makes contact with the dissipated to cool the latter.

In transitory regime, the power drawn from the inverter is higher than in nominal regime and the efficiency of the inverter identical; hence, the energy given off by the power transistors in the form of heat is greater. In order to limit increases in temperature in transitory regime, one solution consists in overdimensioning the cooler.

The heat capacity of a holder made of a given material depends on its mass. Heat capacity is expressed in $Jkg^{-1}K^{-1}$. The problem of storing the additional heat energy dissipated by the electronic transistors in transitory regime is therefore generally solved by increasing the mass and therefore the volume of the holder in order to increase its heat capacity.

Another way of ensuring the transistors are cooled consists in providing a hydraulic system for cooling the dissipator, via a water loop, or heat pipes. Solutions based on water loops create problems with weight and cost. They require expensive fittings, to avoid water leaks, and frequent maintenance or operations or sophisticated maintenance systems, especially to purge them.

Moreover, these solutions may be restrictive from an architectural point of view. As regards heat pipes, the cooler must be oriented in the direction of gravity. One way of overcoming orientation-related problems consists in employing microslopes or gravity-based systems, but there are problems in terms of reliability and maintenance associated with these systems.

SUMMARY OF THE INVENTION

One aim of the invention is to limit at least one of the aforementioned problems.

To this end, one subject of the invention is an energy-converting system comprising a set of at least one load and an inverter comprising transistors, the inverter being intended to convert a DC voltage into an AC voltage that is intended to electrically power the set of at least one load, the inverter being able to be in a set of states comprising a nominal regime and a transitory regime in which the set of at least one load draws, from the inverter, a power higher than a preset maximum power drawn from the inverter when the inverter is in nominal regime, the energy-converting system comprising means for cooling the transistors comprising a holder that is joined to a set of at least one of the transistors of the inverter, the holder comprising a phase-change material that is able to melt, the energy-converting system being configured so that, at a preset ambient temperature, the phase-change material melts when the inverter is in the transitory regime and so that, at the preset ambient temperature, the phase-change material does not melt when the inverter is in the nominal regime. In other words, in transitory regime, the set of at least one load draws, from the inverter, a power higher than a preset maximum power. In nominal regime, the set of at least one load draws a power lower than or equal to the preset maximum power from the inverter.

Advantageously, the phase-change material has a melting point above 70° C.

Advantageously, the phase-change material has a melting point below 100° C. or 120° C.

Advantageously, the ambient temperature is higher than or equal to 30° C.

Advantageously, the inverter remains in the transitory regime for a maximum time of 150 seconds.

Advantageously, the power drawn from the inverter in transitory regime is higher than a maximum permitted power able to be drawn from the inverter for a time of more than 5 minutes without deteriorating the transistors.

Advantageously, the holder comprises a casing enclosing the phase-change material in a seal-type manner.

Advantageously, the casing is interposed between the set of at least one of the transistors of the inverter and a radiator comprising fins making direct physical contact with the surrounding air.

Advantageously, the set of at least one of the transistors of the inverter and the casing are stacked along a stacking axis, the set of at least one of the transistors of the inverter being bounded by a first face and a second face in the stacking direction, the first face facing the casing and the second face being free.

Advantageously, the system comprises heat-exchanging means for promoting heat exchange between the phase-change material and the casing.

The invention also relates to a system according to the invention.

In one particular embodiment, the set of at least one load comprises a plurality of loads comprising a set of at least one electric machine coupled to a turbomachine so as to allow the turbomachine to be started, the energy-converting system being configured so that, at the preset ambient temperature, the phase-change material melts when at least one electric machine of the set of at least one electric machine is starting the turbomachine to which it is coupled. It is a question of the transitory regime.

Advantageously, the system comprises the turbomachine.

For example, the set of at least one load comprises a set of at least one electric machine coupled to a main turbojet of an aircraft so that the electric machine is able to start the main turbojet to which it is coupled, and a set of at least one electric machine, called the auxiliary electric machine, coupled to a turboshaft engine of an auxiliary power unit so that the auxiliary electric machine is able to start the turboshaft engine to which it is coupled, the set of at least one load also comprising an environmental control system. The energy-converting system is configured so that, at the preset ambient temperature, the phase-change material melts when at least one electric machine of the set of at least one electric machine is starting the main turbojet to which it is coupled and/or when at least one auxiliary electric machine of the set of at least one auxiliary electric machine is starting the turboshaft engine to which it is coupled. It is a question of a transitory regime.

The energy-converting system is configured so that, at the preset ambient temperature, the phase-change material remains in the liquid state when the inverter is solely powering the environmental control system. It is a question of the nominal regime.

Advantageously, the system comprises each main turbojet connected to one electric machine of the system and each turboshaft engine of the auxiliary unit coupled to one auxiliary electric machine of the system, and optionally the auxiliary power unit, and the environmental control system.

In one embodiment, the system comprises a set of inverters that is able to power a set of at least one load, the energy-converting system being configured so that, at a preset ambient temperature, the phase-change material melts when at least one inverter of the set of inverters is not powering the set of at least one load whereas each load of the set of at least one load is being powered by the set of inverters. It is a question of the transitory regime. The system is also configured so that, at the preset ambient temperature, the phase-change material remains in the liquid state when all the inverters of the set of inverters are powering the set of at least one load. It is a question of the nominal regime.

The invention also relates to the use of the system according to the invention. This use comprises the phase in which the inverter is in the nominal regime and a phase in which the inverter is in the transitory regime, melting of the phase-change material being triggered when the phase-change material is in the transitory regime.

BRIEF DESCRIPTION OF THE DRAWINGS

The invention will be better understood and further advantages will become apparent upon reading the detailed description of one embodiment provided by way of example, which description is illustrated by the attached drawing, in which.

For the sake of clarity, the same elements will bear the same references in the various figures.

DETAILED DESCRIPTION

Figure 1:
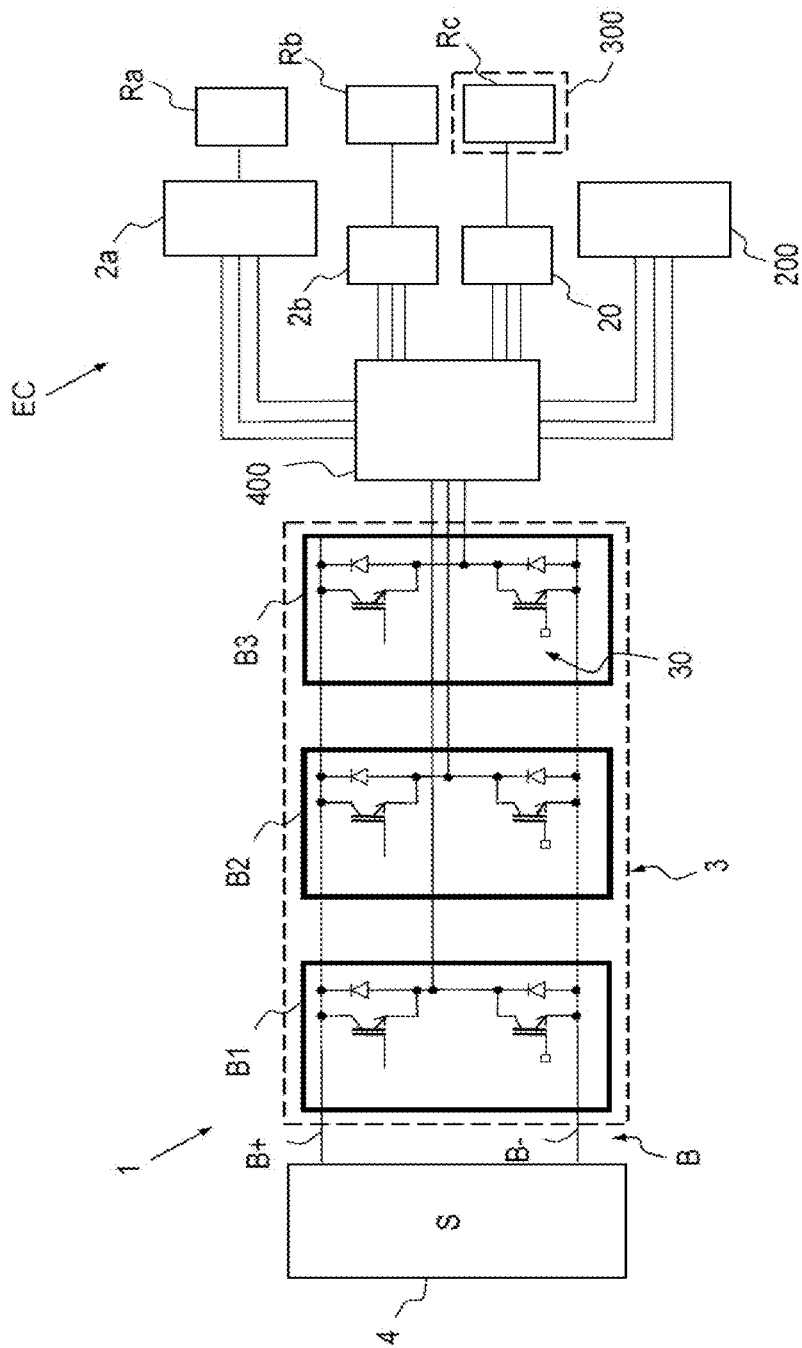
FIG. 1 shows an electrical schematic of an exemplary energy-converting system according to the invention.

The invention relates to an energy-converting system 1 or inverter-based system of the type comprising, as shown in FIG. 1, an inverter 3 connected to an electrical power source 4. The inverter 3 is supplied, by way of input E, with a DC voltage and delivers to its output S, a single-phase or polyphase (in the example of FIG. 1) AC voltage. The energy-converting system comprises a set EC of one or more loads connected to the output of the inverter and intended to be powered by the inverter 3.

The inverter 3 is, for example, intended to power the various electric loads simultaneously or, preferably, in alternation.

In the nonlimiting example of FIG. 1, the inverter is connected to four loads.

In this example, the system comprises two electric machines 2a and 2b that are connected to the output of the inverter so as to be able to be electrically powered by the inverter. Each of these two electric machines 2a, 2b is mechanically coupled to one of the main turbojets Ra, Rb of the aircraft so that each of these two electric machines is able to start the turbojet Ra or Rb to which it is coupled, for example via the mechanical torque generated by the electric machine.

The system also comprises another electric machine 20 that is connected to the output of the inverter so as to be able to be powered by the inverter, and mechanically coupled to a turboshaft engine Rc of an auxiliary power unit or APU, 300. The electric machine 20 is able to start the turboshaft engine Rc.

The system also comprises an environmental control system or ECS, 200 connected to the output of the inverter so as to be able to be electrically powered by the inverter.

The various loads are connected to the inverter via a switching device 400 allowing various loads to be connected in alternation and/or simultaneously to the inverter.

During the phase in which the ECS is powered by the inverter 3, the inverter operates in nominal regime. The ECS draws a substantially constant amount of power from the inverter.

The phases of start-up of the main turbojet and of the turboshaft engine of the APU are momentary phases, i.e. transitory phases of short duration (typically shorter than 60 seconds or 120 seconds or 150 seconds), during which the inverter operates in transitory regime. These transitory phases may be repetitive. The turbines or turboshaft engines may undergo a plurality of successive start-ups. In these transitory phases, the power drawn from the inverter is higher than the power drawn from the inverter when the latter is in nominal regime. The inverter is overloaded, i.e. in transitory regime.

The electric machines 2a, 2b and 20 operate in engine mode in a transitory fashion. Specifically, these electric machines solely serve to start turbines, in start-up phases that are typically shorter than or equal to 60 seconds in length.

The ECS is a nominal load for the inverter. It is intended to draw a power comprised in a preset power interval or a substantially constant preset power. The electric machines are intended to draw a power higher than the powers of the interval or than the preset power.

As a variant, the system for example comprises a single load connected to the output of the inverter and possibly, for example, intended to operate in transitory regime.

Generally, the inverter 3 of the energy-converting system is able to be in a set of states. This set of states comprises at least one nominal regime in which a nominal power lower than or equal to a preset maximum nominal power is drawn by the set of at least one load EC. This set of states also comprises a transitory regime in which the set of at least one load draws, from the inverter, a transitory-regime power higher than the preset maximum nominal power.

The maximum nominal power may be zero or nonzero.

The duration of an operating phase of the inverter in transitory regime is very much shorter than the duration of a stage in which the inverter is in nominal regime. A transitory-regime stage typically lasts between 10 seconds and 150 seconds.

The maximum power drawn from the inverter in transitory regime is, for example, 20% to 100% higher than the maximum power drawn from the inverter in nominal regime.

Typically, the set EC of at least one load draws, from the inverter in transitory regime, a power higher than a maximum permitted power able to be drawn from the inverter for a time of at least 5 minutes without deteriorating the transistors. When such a power higher than this maximum permitted power is drawn, for a long time of at least 5 minutes, from the inverter, the junction temperature of the transistors exceeds a maximum junction temperature acceptable to the transistors.

The maximum power drawn from the inverter in nominal regime is lower than this maximum permitted power.

The inverter 3 comprises three arms B1, B2, B3 each comprising two power transistors 30 mounted in series between a positive terminal B+ and a negative terminal B− of the power bus B that conveys the voltage delivered by the power source 4, i.e. a total of six power transistors 30. The inverter may comprise elements other than the transistors.

Figure 2:
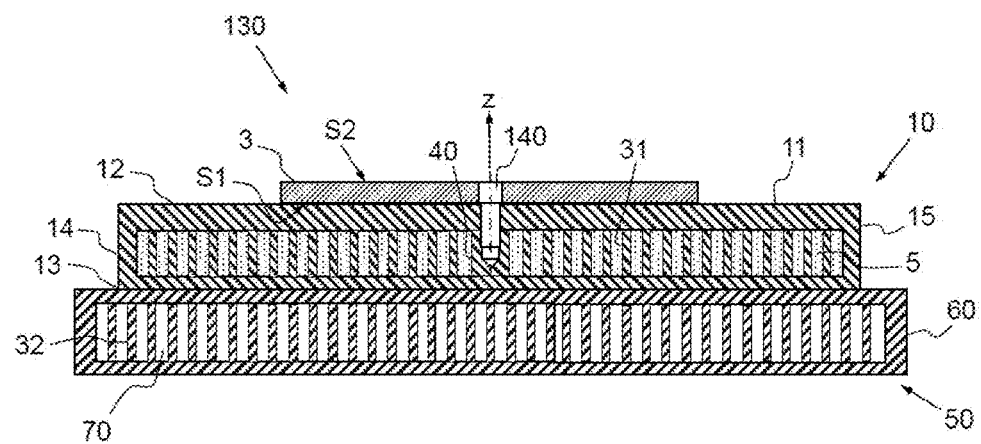
FIG. 2 shows, in cross section, schematically, an energy-converting device comprising an inverter and a cooler.

The energy-converting system 1 also comprises cooling means able to cool the transistors 30 when the inverter 3 is converting a DC voltage into an AC voltage and electrically powering the set of at least one load EC. These cooling means comprise a mechanical holder 10 of a converting device 130 comprising the inverter 3, as shown in FIG. 2, which shows, in cross section, an exemplary converting device 130. The inverter 3 is fastened to the mechanical holder 10, or more generally, joined to the mechanical holder 10.

In order to limit the increase in the temperature of the transistors in transitory regime while limiting the weight and bulk of the energy-converting device, the mechanical holder 10 comprises a phase-change material 5 or PCM, as shown in FIG. 2.

The energy-converting system is configured so that, at a preset ambient temperature, the phase-change material 5 melts in at least one transitory regime, for example in each transitory regime, but does not melt when the inverter is in nominal regime at this ambient temperature. The ambient temperature is the temperature of the air surrounding the inverter.

The preset ambient temperature is preferably higher than or equal to 30° C.

It will be noted that the system according to the invention is for example intended to be used at ambient temperatures comprised between −40° C. and 70° C. This is for example the case with energy-converting systems for aircraft.

In one advantageous embodiment, the preset ambient temperature is above the maximum ambient temperature in which the inverter will be used. This makes it possible to avoid any untimely melting when not in transitory regime.

In other words, the invention consists in producing a holder 10 comprising a phase-change material 5 that stores surplus heat given off by the transistors in transitory regime. This surplus heat is absorbed via a change in the phase of the phase-change material PCM, i.e. using the latent heat of the phase change of the PCM. Thus, the phase-change material is in the solid state, at this ambient temperature, provided that the inverter is in nominal regime or before the inverter has been turned on and melts solely when the inverter is in transitory regime (at this ambient temperature). This allows the increase in the energy of the transistors to be limited and makes it possible to prevent their maximum operating temperature from being exceeded during the transitory regime. The phase-change material melts at a substantially constant temperature while absorbing heat. This allows, for a preset amount of energy dissipated during the transitory regime, the temperature of the transistors to be controlled and regulated.

The energy required to melt a phase-change material is clearly greater than the energy required to increase its temperature while it remains in the solid state.

Thus, the proposed solution allows surplus heat dissipated in transitory regime to be dissipated while limiting the increase in the temperature of the transistors and while limiting the increase in the weight of the holder. Moreover, this solution is simple to implement and insensitive to the (horizontal or vertical) orientation with which the holder is arranged. This thus greatly limits constraints related to the cooling architecture.

Advantageously, the system is configured so that, when the inverter is in a nominal regime consecutive to a transitory regime in which melting was triggered, at the preset ambient temperature, the temperature of the phase-change material decreases, this possibly triggering its solidification if the inverter is in the nominal regime long enough for the temperature of the phase-change material to drop to its solidification point.

Advantageously, the melting point of the PCM is below the maximum operating temperature of the transistors, i.e. below a maximum junction temperature of the transistors (above which temperature the transistors deteriorate).

Advantageously, the melting point of the PCM is below 100° C. or 120° C. so as to guarantee that the junction temperature of the transistors remains below the limiting junction temperature of the transistors.

Advantageously, the melting point of the PCM is above the maximum temperature of the holder, in the nominal regime, at the preset ambient temperature, in order to prevent any untimely melting of the PCM in nominal regime at this ambient temperature.

Advantageously, the melting point of the PCM is above 70° C. or 75° C. The choice of this melting point allows a device to be provided that is compatible with aeronautical applications, and especially able to power motors intended to actuate the jets of an aircraft, in temperate countries where the ambient temperature is below 35° C.

The phase-change material may be based on a material of organic or inorganic type. It may be based on paraffin (paraffin wax for example) and/or at least one vegetable oil, such as coconut oil, rapeseed oil, palm oil or palm-kernel oil and/or at least one fat and/or potassium.

The phase-change material may for example be magnesium chloride hexahydrate ($MgCl_2 \cdot 6H_2O$). Its melting point is 117° C. and it is able to absorb an energy of 165000 J/kg. Its density is 1.57 g/cm$^3$, which is clearly lower than that of aluminum (2.7 g/cm$^3$). The heat capacity of aluminum, for an increase of 1° C., is 897 J/kg. Aluminum is therefore heavier and has a much lower capacity to absorb heat than the PCM.

The melting point of potassium is 63.5° C. Paraffin has the molecular formula $C_nH2_{n+2}$, where the value of n is located between 18 and 32, and the value of its molar mass is located between 275 and 600 g/mol. The phase-change material may, for example, comprise at least one paraffin the n of which is comprised between 20 and 40. This type of paraffin has a melting point comprised between 50° C. and 62° C. The melting point of phase-change materials is related to the number of carbon atoms in the hydrocarbon chain. The material (number of carbon atoms) may be chosen depending on the desired melting point. The material for example comprises a paraffin wax, the CAS number of which is 8002-74-2 or the EINECS number of which is -315-6.

The phase-change material 5 has a preset phase-change temperature. To this end, this material may be obtained by hydrogenation of a material on the basis of which it is produced and/or may comprise an antioxidant so as to obtain a desired melting point. Generally, the higher the number of bonds between molecules or atoms, the higher the phase-change temperature will be.

The phase-change material may comprise an additive so as to obtain the right melting point.

Figure 3:
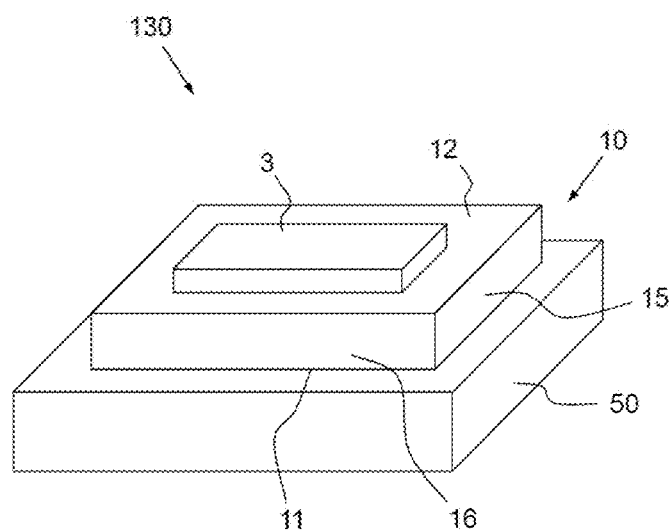
FIG. 3 shows, in perspective.

As shown in FIG. 3, the holder 10 comprises at least one casing 11 enclosing the phase-change material 5 in a seal-tight manner in order to prevent the material from leaving the casing in the first and in the second state. The casing 11 is made from a material that remains solid in the nominal and transitory regimes. This material advantageously has a melting point above the maximum junction temperature of the transistors.

The casing 11 is, for example, made of metal. It is for example made of aluminum, which has a good heat capacity and is light, or made of copper. As a variant, the casing is made of graphite.

In the example of FIGS. 2 and 3, the casing 11 comprises walls 12, 13, 14, 15, 16, not all of which are shown in these figures. These walls bound internally in a seal-tight manner a cavity 20. These walls are made of a first material.

In the example of the figures, the casing 11 bounds a substantially parallelepipedal cavity 20. The casing comprises two long walls 12, 13 taking the form of substantially rectangular planar parallel plates that are joined to each other by side walls comprising four side walls 14 to 16, not all of which are shown, taking the form of substantially rectangular planar plates that are perpendicular to the two long walls 12, 13 and parallel pairwise.

The phase-change material 5 is inserted into the cavity 20 as shown in cross section in FIG. 2.

One of the weak points of phase-change materials is their low thermal conductivity. Aluminum for example has a thermal conductivity of 160 $W \cdot m^{-1} \cdot K^{-1}$ whereas a phase-change material has a thermal conductivity of about 0.3 $W \cdot m^{-1} \cdot K^{-1}$.

Advantageously, the holder 10 comprises heat-exchanging means 31, or an internal heat-exchanging structure, for promoting heat exchange between the phase-change material and the casing 11. This allows a transmission of heat to the portion of the phase-change material furthest from the walls of the casing to be guaranteed and therefore the proportion of the phase-change material that will actually change phase to limit, as much as possible, the increase in temperature, to be maximized.

These heat-exchanging means 31, which have a thermal conductivity higher than the phase-change material 5, are placed in the cavity 20 and make direct physical contact with the casing 11 in order to promote heat exchange between the casing 11 and the phase-change material. This allows the contact area between the casing 11 and the phase-change material 5 to be increased.

Thus, the cavity 20 comprises a portion occupied by the heat-exchanging means 32 and a volume in which the phase-change material is placed. The heat-exchanging means are embedded in the phase-change material placed in the cavity.

The phase-change material 5 advantageously makes physical contact with the heat-exchanging means 32 in order to promote heat exchange between the transistors in the phase-change material 5. Advantageously, this physical contact is direct.

The heat-exchanging means 31 comprise, in the example of the figures, fins 31 that protrude from at least one of the two longest walls 12, 13 of the casing. These fins 31 are placed in the cavity 20.

More generally, the casing 11 comprises fins 31 that protrude into the cavity 20 on at least one of the walls of the casing bounding the cavity 20.

Each fin 31 may be integral with the wall from which it protrudes or indeed be fastened to this wall.

In the nonlimiting embodiment of the figures, the fins 31 have a shape that is on the whole parallelepipedal. These fins are produced in the form of substantially planar plates.

These fins may be integral with at least one of the two long walls 12, 13. The heat-exchanging means may, as a variant or in addition, comprise a sheet which is folded so as to form fins, the sheet being fastened to one of the long walls of the casing.

As a variant and/or in addition to the fins 31, the heat-exchanging means may comprise a porous structure made of a material having a thermal conductivity higher than the phase-change material and containing pores that accommodate the phase-change material and/or a bundle of material having a thermal conductivity higher than the phase-change material.

By bundle of material, what is meant is a winding of a wire of the material.

By porous structure, what is meant is a porous material containing pores arranged in a disordered fashion.

The pores typically have a size comprised between 2 and 5 mm. The porous material typically has a porosity comprised between 60 and 70% of the volume of the porous material.

The heat-exchanging means 31 may be made from the same material as the casing 11. As a variant, the heat-exchanging means 31 comprise at least one other material having a higher thermal conductivity than the phase-change material 5, such as, for example, copper or graphite.

Just like the fins, each of the heat-exchanging means may be fastened to the casing or be integral with the casing.

The energy-converting device comprises transistors that are fastened to the holder 10, and more precisely to the casing 11, by fastening means. The casing may comprise, as shown in FIG. 2, protrusions 40 that protrude from at least one of the long faces 12, 13 bounding a hole that accommodates the fastening means 140. When the holder 10 comprises fins, these fins are in addition to the protrusions 40, when the latter are present.

As shown in FIGS. 2 and 3, the energy-converting device 130 may comprise, but this is not obligatory, a radiator 50 that forms part of the cooling means. The radiator 50 comprises the fins of the radiator 32, which make direct physical contact with the surrounding air 70. The casing 11 is interposed between the radiator 50 and the transistors 30 or the inverter 3. The proposed solution allows the size of the radiator to be limited and allows the need to employ a cooling solution involving a heat pipe or water loop to be limited and therefore their respective drawbacks to be avoided. The cooling means may comprise means for achieving a forced flow of air 70, such as, for example, a fan.

Preferably, the holder 11 and the inverter 3 are stacked along a stacking axis z. The holder 11 is interposed between the inverter 3 and the radiator 32 along the stacking axis z.

Advantageously, the inverter 3, at least one transistor of the inverter or at least one arm of the inverter, is bounded by two surfaces S1 and S2, which are spaced apart along the axis x. These two surfaces S1 and S2 comprise a first surface S1 facing the casing 11 and a free second surface S2. This configuration is suitable for conventional, commercial off-the-shelf (COTS) transistors and/or inverters, these being compatible with a cooling device, conventionally based on copper or AlSiC, placed facing a single one of the faces bounding the transistor or the inverter along the stacking axis.

Advantageously, the casing 11 extends over the entirety of the first surface S1. This first surface S1 bounds, for example, the inverter 3 or a single arm B1 or B2 of the inverter 3 or a single transistor 30 of the set of transistors of the inverter 3.

In the example of the figures, the inverter 3 is fastened to the mechanical holder. More broadly, the energy-converting system comprises at least one converting device comprising at least one transistor of the inverter and a mechanical holder comprising a phase-change material such as described above.

The invention also has the advantage of being modular.

The invention also relates to a vehicle, an aircraft for example, comprising an energy-converting system according to the invention.

The invention also relates to a method for using the energy-converting system according to the invention.

This method comprises:
a first stage in which the inverter operates in transitory regime,
and optionally a second stage in which the inverter is in nominal regime.

The phase-change material melts when the phase-change material is in the transitory regime.

The phase-change material does not melt in the second stage.

A transitory regime that causes the phase-change material to melt may be a phase of starting an engine, a turbine for example, by means of an electric machine powered by the inverter.

The invention claimed is:

1. An energy-converting system comprising a set of at least one load and an inverter comprising transistors, the inverter being intended to convert a DC voltage into an AC voltage that is intended to electrically power the set of at least one load, the inverter being able to be in a set of states comprising a nominal regime and a transitory regime, the set of at least one load drawing, in transitory regime, from the inverter, a power higher than a preset maximum power, the set of at least one load drawing, from the inverter in nominal regime, a power lower than or equal to the preset maximum power, the energy-converting system comprising means for cooling the transistors comprising a holder that is joined to a set of at least one of the transistors of the inverter, the holder comprising a phase-change material, the energy-converting system being configured so that, at a preset ambient temperature, the phase-change material melts when the inverter is in the transitory regime and so that, at the preset ambient temperature, the phase-change material does not melt when the inverter is in the nominal regime, the holder comprising a casing enclosing the phase-change material in a seal-tight manner, the casing being interposed between the set of at least one of the transistors of the inverter and a radiator comprising fins in direct physical contact with the surrounding air.

2. The system as claimed in claim 1, wherein the phase-change material has a melting point above 70° C.

3. The system as claimed in claim 1, wherein the phase-change material has a melting point below 100° C. or 120° C.

4. The system as claimed in claim 1, wherein the ambient temperature is higher than or equal to 30° C.

5. The system as claimed in claim 1, wherein the inverter remains in the transitory regime for a maximum time of 150 seconds.

6. The system as claimed in claim 1, wherein the power drawn from the inverter in transitory regime is higher than a maximum permitted power able to be drawn from the inverter for a time of more than 5 minutes without deteriorating the transistors.

7. The system as claimed in claim 1, wherein the set of at least one of the transistors of the inverter and the casing are stacked along a stacking axis (z), the set of at least one of the transistors of the inverter being bounded by a first face (S1) and a second face (S2) in the stacking direction (z), the first face (S1) facing the casing and the second face (S2) being free.

8. The system as claimed in claim 7, comprising heat-exchanging means for promoting heat exchange between the phase-change material and the casing.

9. The system as claimed in claim 1, wherein the set of at least one load comprises a plurality of loads comprising a set of at least one electric machine coupled to a turbomachine so as to allow the turbomachine to be started, the energy-converting system being configured so that, at the preset ambient temperature, the phase-change material melts when at least one electric machine of the set of at least one electric machine is starting the turbomachine to which it is coupled.

10. The system as claimed in claim 9, wherein the set of at least one load comprises a set of at least one electric machine coupled to a main turbojet of an aircraft so that the electric machine is able to start the main turbojet to which it is coupled, and a set of at least one electric machine, called the auxiliary electric machine, coupled to a turboshaft engine of an auxiliary power unit so that the auxiliary electric machine is able to start the turboshaft engine to which it is coupled and an environmental control system, the energy-converting system being configured so that, at the preset ambient temperature, the phase-change material melts when at least one electric machine of the set of at least one electric machine is starting the turbojet to which it is coupled and/or when at least one auxiliary machine of the set of at least one auxiliary electric machine is starting the turboshaft engine to which it is coupled, the energy-converting system being configured so that, at the preset ambient temperature, the phase-change material remains in the liquid state when the inverter is solely powering the environmental control system.

11. The system as claimed in claim 1, comprising a set of inverters that is able to power a set of at least one load, the energy-converting system being configured so that, at the preset ambient temperature, the phase-change material melts when at least one inverter of the set of inverters is not powering the set of at least one load, each load of the set of at least one load being powered by the set of inverters, and the energy-converting system being configured so that, at the preset ambient temperature, the phase-change material remains in the liquid state when all the inverters of the set of inverters are powering the set of at least one load.

12. A vehicle comprising a system as claimed in claim 1.

13. The use of the energy-converting system as claimed in claim 1, comprising the phase wherein the inverter is in the nominal regime and a phase wherein the inverter is in the transitory regime, the phase-change material melting when the phase-change material is in the transitory regime.

* * * * *